(12) United States Patent
Xi et al.

(10) Patent No.: US 10,090,684 B2
(45) Date of Patent: Oct. 2, 2018

(54) GENERAL CONTROL CIRCUIT FOR ACTIVE BALANCE

(71) Applicant: Hangzhou Xieneng Technology Co., LTD., Hangzhou (CN)

(72) Inventors: Danji Xi, Hangzhou (CN); Yongan Huang, Hangzhou (CN); Xunwei Zhou, Hangzhou (CN); Pitleong Wong, Hangzhou (CN)

(73) Assignee: HANGZHOU XIENENG TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 15/642,021

(22) PCT Filed: Jan. 7, 2016

(86) PCT No.: PCT/CN2016/070424
§ 371 (c)(1),
(2) Date: Jul. 5, 2017

(87) PCT Pub. No.: WO2016/110264
PCT Pub. Date: Jul. 14, 2016

(65) Prior Publication Data
US 2018/0019599 A1    Jan. 18, 2018

(30) Foreign Application Priority Data
Jan. 7, 2016 (CN) .......................... 2015 1 0005881

(51) Int. Cl.
*H02J 7/00* (2006.01)
*G01R 31/36* (2006.01)

(52) U.S. Cl.
CPC .......... *H02J 7/0014* (2013.01); *G01R 31/362* (2013.01); *H02J 7/0019* (2013.01); *H02J 7/0072* (2013.01)

(58) Field of Classification Search
CPC ........ H02J 7/0014; H02J 7/007; H02J 7/0016; H02J 2007/0037; H02J 2007/0098
(Continued)

(56) References Cited

U.S. PATENT DOCUMENTS 9,525,298 B1* 12/2016 Pham .................... H02J 7/0068
9,755,451 B2* 9/2017 Butzmann ........... H01M 10/425

* cited by examiner

*Primary Examiner* — Nghia Doan
(74) *Attorney, Agent, or Firm* — Treasure IP Group, LLC

(57) ABSTRACT

A general control circuit for active balance comprises a first sampling wire (11) and a second sampling wire (12) by which voltages of adjacent battery packs (4) are sampled respectively. A first voltage division circuit which is composed of a fourth resistor (R4) and a fifth resistor (R5) connected in series, is connected to the first sampling wire. The voltage division terminal (p) of the first voltage division circuit is connected to one input terminal of a first operational amplifier ($U_1$) and one input terminal of a second operational amplifier ($U_2$) to provide a reference voltage (Vref) for the first operational amplifier and the second operational amplifier. A second voltage division circuit which is composed of a first resistor (R1), a second resistor (R2) and a third resistor (R3) connected in series, is connected to the second sampling wire. The voltage division terminal (m) connected between the first resistor and the second resistor is connected to the other input terminal of the first operational amplifier. The voltage division terminal (n) connected between the second resistor and the third resistor is connected to the other input terminal of the second operational amplifier. The output terminal of the first operational amplifier is connected to an upward energy transfer circuit (2) of a power balance circuit. The output terminal of the second operational amplifier is connected to a downward energy transfer circuit (3) of the power balance circuit. The general control circuit is low in cost, easy to be modularized and convenient to be applied.

6 Claims, 4 Drawing Sheets

(58) Field of Classification Search
USPC .................................. 320/102–103, 156–163
See application file for complete search history.

GENERAL CONTROL CIRCUIT FOR ACTIVE BALANCE

CROSS-REFERENCE TO RELATED APPLICATION

This application claims the benefit of Chinese Patent Application No. 201510005881.0, filed on Jan. 7, 2015, which is incorporated herein by reference in its entirety.

BACKGROUND OF THE DISCLOSURE

Field of the Disclosure

The disclosure relates to a general control circuit for active balance.

Background of the Disclosure

As shown in FIG. 1, a conventional power balance circuit generally samples voltages of all the battery cells by using a microcontroller unit (MCU), and then calculates the capacity of the battery cells to determine which ones of the battery cells have a capacity larger than an average value and which ones of the battery cells have a capacity smaller than the average value. The battery cells with the capacity larger than the average value need to be discharged and the battery cells with the capacity smaller than the average value need to be charged. Finally, a power switch of a corresponding balance circuit is controlled to make the whole of the battery pack charged by the battery cells with the capacity larger than the average value and make the battery cells with the capacity smaller than the average value charged by the whole of the battery pack. That is, the power balance circuit samples battery voltages through the MCU, then calculates the transfer direction of battery energy and finally controls the power switch to perform energy transfer.

However, the above circuit is complex and expensive, because it needs an MCU, an isolation chip for sampling, a driving chip for controlling switches. The development cost is also high due to the complexity of the balance algorithm. Furthermore, the developers need to do considerable research on the battery and the batteries designed by different developers will have different effects.

There is also another specific integrated circuit for balance, in which sampling and balance are performed under time-sharing process, for avoiding mutual interference.

As shown in FIG. 2, the integrated circuit samples the battery voltages, then calculates and compares the capacity of the adjacent battery cells to determine the transfer direction of energy between the adjacent battery cells and finally controls the power switch and transfers energy through a transformer. This scheme is expensive due to the necessity of using the specific integrated chip, poor flexibility in application for various battery packs having different quantities of series-connected batteries, and difficult to be modularized. And the specific integrated chip can only sample the battery voltages which are within a limited range and is not applicable to control the balance of high-voltage battery packs.

SUMMARY OF THE DISCLOSURE

The present disclosure provides a general control circuit for active balance which is low in cost, good flexible to be applied and easy to be modularized.

The technical scheme employed by the disclosure is as follows.

A general control circuit for active balance, comprises: a first sampling wire and a second sampling wire by which voltages of adjacent battery packs are sampled respectively, wherein a first voltage division circuit which is composed of a fourth resistor and a fifth resistor connected in series is connected to the first sampling wire, a voltage division terminal of the first voltage division circuit is connected to one input terminal of a first operational amplifier and one input terminal of a second operational amplifier to provide a reference voltage for the first operational amplifier and the second operational amplifier, a second voltage division circuit which is composed of a first resistor, a second resistor and a third resistor connected in series, is connected to the second sampling wire, a voltage division terminal connected between the first resistor and the second resistor is connected to the other input terminal of the first operational amplifier, a voltage division terminal connected between the second resistor and the third resistor is connected to the other input terminal of the second operational amplifier, an output terminal of the first operational amplifier is connected to an upward energy transfer circuit of a power balance circuit, an output terminal of the second operational amplifier is connected to a downward energy transfer circuit of the power balance circuit. The control circuit according to the disclosure samples the voltages of adjacent battery packs, separately. After sampling, the voltages are logically calculated and compared by the two operational amplifiers, and then an upward energy transfer control signal is output from the first operational amplifier to the upward energy transfer circuit, or a downward energy transfer control signal is output from the second operational amplifier to the downward energy transfer circuit, thus energy transfer between the adjacent battery packs can be realized, wherein ordinary operational amplifiers can be used to achieve the function of the control circuit, so that the control circuit is low in cost, widely applicable, easy to be modularized, convenient to be applied and suitable to control the power balance circuit of high-voltage battery packs.

Further, when each division voltage of the second voltage division circuit is larger than the reference voltage, the first operational amplifier outputs a high-level signal and the second operational amplifier outputs a low-level signal, when each division voltage of the second division circuit is smaller than the reference voltage, the first operational amplifier outputs a low-level signal and the second operational amplifier outputs a high-level signal.

Further, when each division voltage of the second division circuit is equal or nearly equal to the reference voltage, the first operational amplifier outputs a low-level signal and the second operational amplifier outputs a low-level signal. At that time, neither the upward energy transfer circuit nor the downward energy transfer circuit of the power balance circuit operates.

Further, resistance values of the first resistor and the third resistor are much larger than that of the second resistor. The second resistor in the second voltage division circuit is used for making the two division voltages of the second voltage division circuit approximately equal and also preventing the balance circuit from continuously transferring energy back and forth which to reduce the energy loss in the circuit in order to avoid energy waste.

Further, voltage division proportion of the first voltage division circuit is larger than that of the voltage division terminal connected between the second resistor and third resistor and smaller than that of the voltage division terminal connected between the first resistor and the second resistor.

Further, a voltage follower is provided at the voltage division terminal of the first voltage division circuit. The voltage follower is used for increasing the driving capability of the reference voltage, avoiding interference and preventing the reference voltage from being deviated by loads. If the voltage sampled by the first sampling wire is small and within the input voltage range of the selected one of the first operational amplifier and the second operational amplifier, the first voltage division circuit and the voltage follower are no longer necessary here, because at the situation, the battery itself is a strong power source.

The disclosure has beneficial effects as follows: it is suitable to control the power balance circuit of high-voltage battery packs; it is low in cost, because ordinary operational amplifiers can be used as the main components of the control circuit; it has a wide application range, for example, it can be used in a buck circuit, a boost circuit, a flyback circuit, or a forward circuit; also, it can be simply modularized and conveniently applied.

DETAILED DESCRIPTION OF THE DISCLOSURE

The disclosure is described in connection with specific embodiments, but the disclosure is not limited to these embodiments. It will be appreciated by those skilled in the art that the present disclosure encompasses all alternatives, modifications and equivalents that may be included within the scope of the claims.

Figure 1:
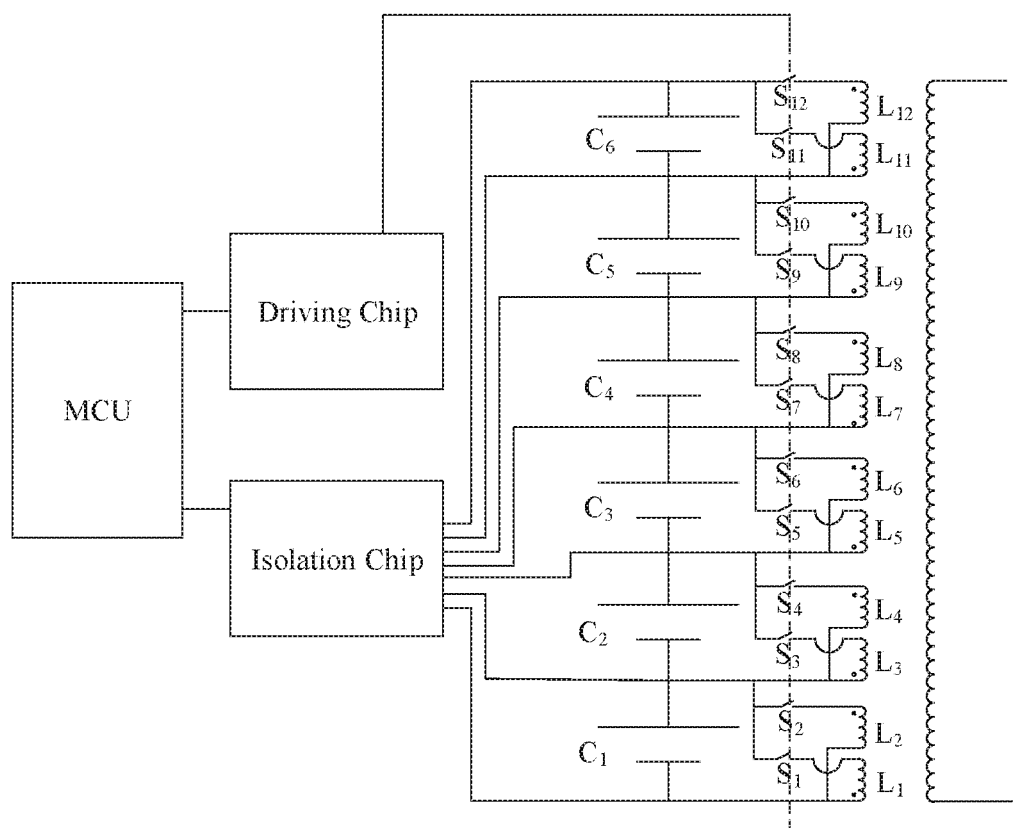
FIG. 1 is a schematic circuit diagram of a conventional power balance circuit.
Figure 2:
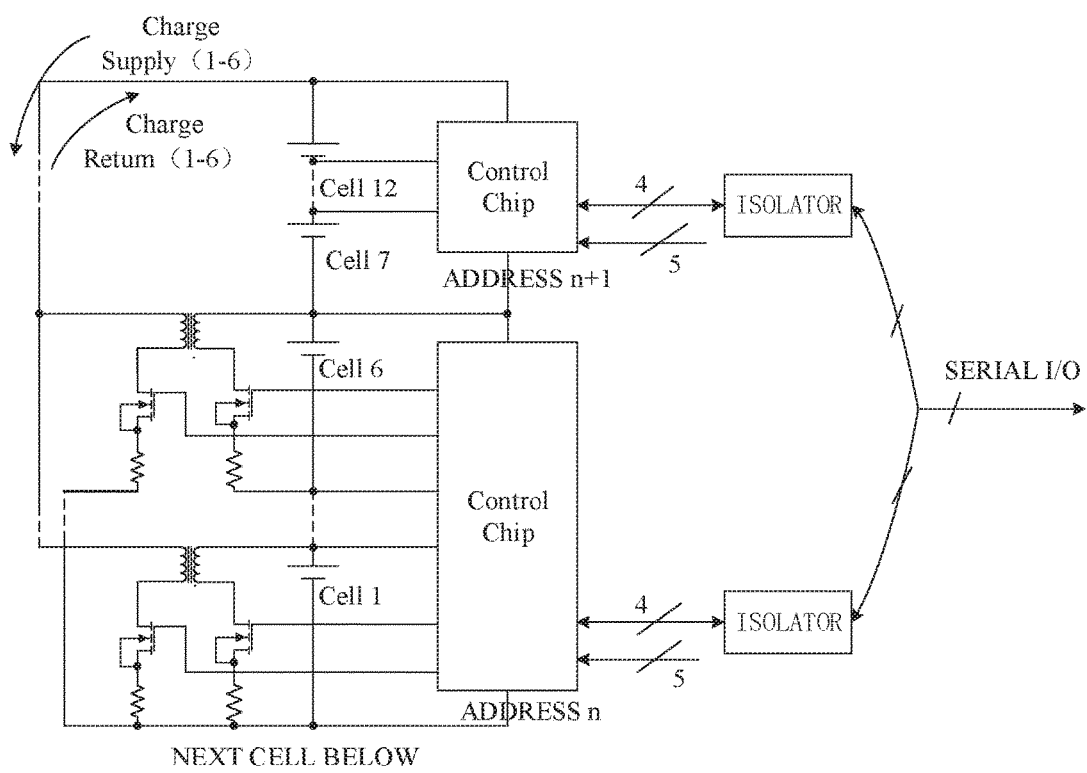
FIG. 2 is another schematic circuit diagram of a conventional power balance circuit.
Figure 3:
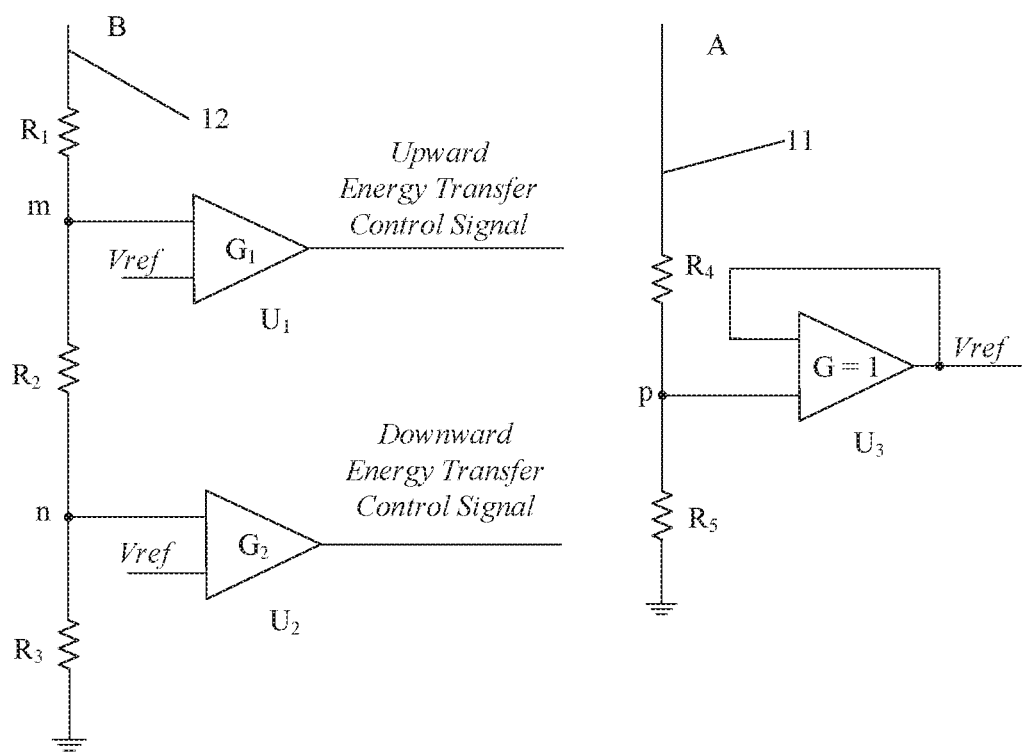
FIG. 3 is a schematic circuit diagram according to an embodiment of the present disclosure.
Figure 4:
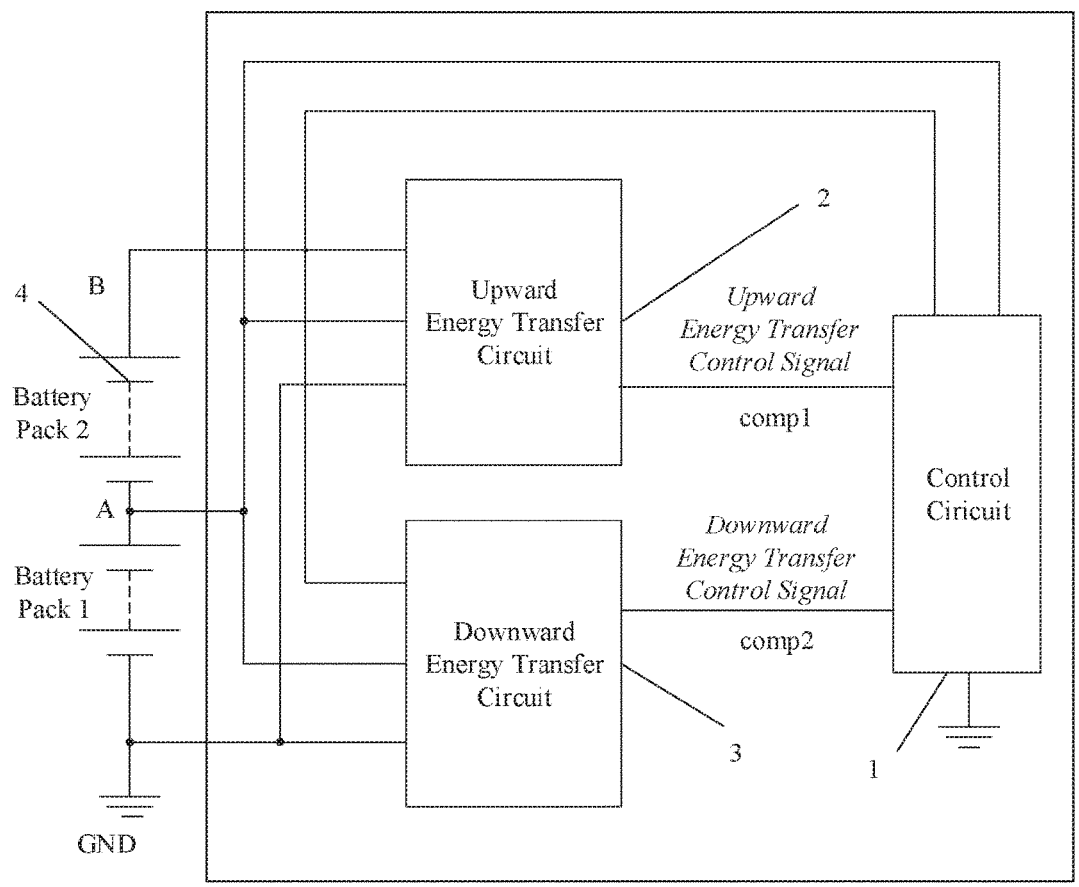
FIG. 4 is a structural schematic diagram according to one embodiment of the present disclosure.

As referring to FIGS. 3 to 4, a general control circuit for active balance includes: a first sampling wire 11 and a second sampling wire 12 by which voltages of adjacent battery packs 4 are sampled respectively, wherein a first voltage division circuit which is composed of a fourth resistor $R_4$ and a fifth resistor $R_5$ connected in series is connected to the first sampling wire 11, a voltage division terminal p of the first voltage division circuit is connected to one input terminal of a first operational amplifier $U_1$ and one input terminal of a second operational amplifier $U_2$ to provide a reference voltage for the first operational amplifier $U_1$ and the second operational amplifier $U_2$, a second voltage division circuit which is composed of a first resistor $R_1$, a second resistor $R_2$ and a third resistor $R_3$ connected in series, is connected to the second sampling wire 12, a voltage division terminal m connected between the first resistor $R_1$ and the second resistor $R_2$ is connected to the other input terminal of the first operational amplifier $U_1$, a voltage division terminal n connected between the second resistor $R_2$ and the third resistor $R_3$ is connected to the other input terminal of the second operational amplifier $U_2$, an output terminal of the first operational amplifier $U_1$ is connected to an upward energy transfer circuit 2, an output terminal of the second operational amplifier $U_2$ is connected to a downward energy transfer circuit 3. The control circuit 1 according to the disclosure samples the voltages of adjacent battery packs 4, separately. After sampling, the voltages are logically calculated and compared by the two operational amplifiers, and then an upward energy transfer control signal is output from the first operational amplifier $U_1$ to the upward energy transfer circuit 2, or a downward energy transfer control signal is output from the second operational amplifier $U_2$ to the downward energy transfer circuit 3, thus energy transfer between the adjacent battery packs 4 can be realized, wherein ordinary operational amplifiers can be used to achieve the function of the control circuit 1, so that the control circuit is low in cost, widely applicable, easy to be modularized, convenient to be applied, and suitable to control the power balance circuit of high-voltage battery packs.

In the embodiment, when the division voltages Vm and Vn of the second voltage division circuit are both larger than the reference voltage Vref, the first operational amplifier $U_1$ outputs a high-level signal and the second operational amplifier $U_2$ outputs a low-level signal; when the division voltages Vm and Vn of the second division circuit are both smaller than the reference voltage Vref, the first operational amplifier $U_1$ outputs a low-level signal and the second operational amplifier $U_2$ outputs a high-level signal.

In the embodiment, when the division voltages Vm and Vn of the second division circuit are both equal or nearly equal to the reference voltage Vref, the first operational amplifier $U_1$ outputs a low-level signal and the second operational amplifier $U_2$ outputs a low-level signal. At the time, neither the upward energy transfer circuit 2 nor the downward energy transfer circuit 3 of the power balance circuit operates.

In the embodiment, resistance values of the first resistor R1 and the third resistor R3 are much larger than that of the second resistor R2, that is, R1>>R2, R3>>R2. The second resistor R2 in the second voltage division circuit is used for making the two division voltages Vm and Vn of the second voltage division circuit approximately aqual and also preventing the balance circuit from continuously transferring energy back and forth which to reduce the energy loss consumed in the circuit in order to avoid energy waste.

In the embodiment, voltage division proportion of the first voltage division circuit is larger than that of the voltage division terminal connected between the second resistor $R_2$ and third resistor $R_3$ and smaller than that of the voltage division terminal connected between the first resistor $R_1$ and the second resistor $R_2$, that is, $R_3/(R_1+R_2+R_3)<R_5/(R_4+R_5)<(R_2+R_3)/(R_1+R_2+R_3)$.

In the embodiment, a voltage follower $U_3$ is provided at the voltage division terminal p of the first voltage division circuit, which is used for increasing the driving capability of the reference voltage, avoiding interference and preventing the reference voltage from being deviated by loads. If the voltage sampled by the first sampling wire 11 is small and within the input voltage range of the selected one of the first operational amplifier and the second operational amplifier, the first voltage division circuit and the voltage follower $U_3$ are no longer necessary here, because at the situation, the battery itself is a strong power source.

The operational principle of the disclosure is as follows.

The power portion of the balance circuit is composed of the upward energy transfer circuit 2 and the downward energy transfer circuit 3.

The topologies of the upward energy transfer circuit 2 and the downward energy transfer circuit 3 can be selected from a group consisting of buck topology, boost topology, flyback topology and forward topology, which makes the circuit widely applicable. The specific type of the topologies can be selected according to the actual requirements on power, voltage class, etc. For example, if the the power is small and the voltage class is low, buck or boost topology can be selected, if the power is medium and the voltage class is high, flyback topology can be selected, and if the power is large and the voltage class is high, forward or push-pull topology can be selected.

Regarding the direction from the positive terminal to the negative terminal of the battery pack as a downward direction, downward energy transfer is referred to as an energy transfer from an upper battery pack to a lower battery pack, upward energy transfer is referred to as an energy transfer from a lower battery pack to an upper battery pack.

The control circuit first samples a high-value voltage $V_A$ of the lower battery pack by the first sampling wire 11 and obtains the reference voltage Vref by using the fourth resistor $R_4$ and the fifth resistor $R_5$ of the first voltage division circuit, and the reference voltage Vref is used as a reference value of the first operational amplifier $U_1$ and the second operational amplifier $U_2$.

Then the control circuit samples a high-value voltage $V_B$ of the upper battery pack by the second sampling wire 12, and obtains the voltages Vm and Vn by using the first resistor $R_1$, the second resistor $R_2$ and the third resistor $R_3$ of the second voltage division circuit. The voltages Vm and Vn are used as the output voltages sampling signal of the upward energy transfer circuit and the downward energy transfer circuit respectively, and Vm and Vn are compared with Vref respectively to generate error signals which can represent the errors of the output voltages of the upward and the downward energy transfer circuits. Then, the error signals are introduced to the corresponding compensation pins of the control chip (such as the pin comp of a series 38xx chip) of the upward energy transfer circuit and the downward energy transfer circuit after compensation, thus the control of the power loop circuits is realized.

The control circuit 1 realizes the control of the power loop circuits by controlling the corresponding compensation pins of the control chip, so when the capability of the current output by the operational amplifiers is much greater than that of the current generated at the pin comp itself, the control circuit 1 can control the pins comp effectively, which means the external compensation circuit overrides the internal compensation loop circuit.

Assuming that the voltages of the two battery packs are in balance, that is, $V_B \approx 2V_A$, the resistors $R_1$, $R_2$ and $R_3$ are set to realize voltage division which makes Vm equal to or slightly larger than Vref and makes Vn equal to or slightly smaller than Vref, at the situation, the upward energy transfer control signal and the downward energy transfer control signal output are both low, which pulls down voltages of the compensation pins comp of the control chip of the balance circuit. As a result, the circuit stops operating. The upward energy transfer direction and the downward energy transfer direction of the control circuit are logically opposite, which cannot be followed at the same time. After the balance circuit is powered on, the control circuit 1 compares the value of $V_A$ with the value of $V_B-V_A$ to determine the voltage values of the two battery packs 4.

If $V_A$ is small, i.e., $V_A<\frac{1}{2}V_B$, $V_A$ is divided by the fourth resistor $R_4$ and the fifth resistor $R_5$ to obtain the reference voltage Vref, $V_B$ is divided by the first resistor $R_1$, the second resistor $R_2$ and the third resistor $R_3$ to obtain Vm and Vn. Due to the dead zone formed by the second resistor $R_2$, Vn is slightly smaller than Vm, which prevents the balance circuit from continuously transferring energy back and forth.

$V_A<\frac{1}{2}V_B$, so Vm>Vref and Vn>Vref, after the logical calculation done by the first and second operational amplifiers, the first operational amplifier $U_1$ outputs a low-level voltage and the second operational amplifier $U_2$ outputs a high-level voltage, that is, the downward energy control signal is output to the corresponding pin comp of the control chip of the downward energy transfer circuit 3, then the power balance circuit starts to operate and the energy transfers from the upper battery pack to the lower battery pack.

If $V_B-V_A$ is small and $V_A>\frac{1}{2}V_B$, likewise, $V_A$ is divided by the fourth resistor $R_4$ and the fifth resistor $R_5$ to obtain Vref and $V_B$ is divided by the first resistor $R_1$, the second resistor $R_2$ and the third resistor $R_3$ to obtain Vm and Vn. Because $V_A>\frac{1}{2}V_B$, Vm<Vref and Vn<Vref, after the logical calculation done by the first and second operational amplifiers, the first operational amplifier U1 outputs a high-level voltage and the second operational amplifier $U_2$ outputs a low-level voltage, that is, the upward energy transfer control signal is output to the corresponding pin comp of the control chip of the upward energy transfer circuit 2, then the power balance circuit starts to operate and the energy transfers from the lower battery pack to the upper battery pack.

The invention claimed is:

1. A general control circuit for active balance, comprises:
  a first sampling wire and a second sampling wire by which voltages of adjacent battery packs are sampled respectively,
  wherein a first voltage division circuit which is composed of a fourth resistor and a fifth resistor connected in series is connected to said first sampling wire, a voltage division terminal of said first voltage division circuit is connected to one input terminal of a first operational amplifier and one input terminal of a second operational amplifier to provide a reference voltage for said first operational amplifier and said second operational amplifier, a second voltage division circuit which is composed of a first resistor, a second resistor and a third resistor connected in series, is connected to said second sampling wire, a voltage division terminal connected between said first resistor and said second resistor is connected to the other input terminal of said first operational amplifier, a voltage division terminal connected between said second resistor and said third resistor is connected to the other input terminal of said second operational amplifier, an output terminal of said first operational amplifier is connected to an upward energy transfer circuit of a power balance circuit, an output terminal of said second operational amplifier is connected to a downward energy transfer circuit of said power balance circuit.

2. The general control circuit according to claim 1, wherein when each division voltage of said second voltage division circuit is larger than said reference voltage, said first operational amplifier outputs a high-level signal and said second operational amplifier outputs a low-level signal, when each division voltage of said second division circuit is smaller than said reference voltage, said first operational amplifier outputs a low-level signal and said second operational amplifier outputs a high-level signal.

3. The general control circuit according to claim 1, wherein when each division voltage of said second division circuit is equal or nearly equal to said reference voltage, said first operational amplifier outputs a low-level signal and said second operational amplifier outputs a low-level signal.

4. The general control circuit according to claim 1, wherein resistance values of said first resistor and said third resistor is much larger than that of said second resistor.

5. The general control circuit according to claim 1, wherein voltage division proportion of said first voltage division circuit is larger than that of said voltage division terminal connected between said second resistor and third resistor and smaller than that of said voltage division terminal connected between said first resistor and said second resistor.

6. The general control circuit according to claims 1, wherein a voltage follower is provided at said voltage division terminal of said first voltage division circuit.

* * * * *